United States Patent
Wang et al.

(10) Patent No.: US 9,698,178 B2
(45) Date of Patent: Jul. 4, 2017

(54) ARRAY SUBSTRATE, METHOD FOR MANUFACTURING THE SAME, AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Yuliang Wang, Beijing (CN); Daeyoung Choi, Beijing (CN); Zengli Liu, Beijing (CN); Daojie Li, Beijing (CN); Shijuan Chen, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 14/897,525

(22) PCT Filed: Apr. 30, 2015

(86) PCT No.: PCT/CN2015/077903
§ 371 (c)(1),
(2) Date: Dec. 10, 2015

(87) PCT Pub. No.: WO2016/119324
PCT Pub. Date: Aug. 4, 2016

(65) Prior Publication Data
US 2016/0343748 A1    Nov. 24, 2016

(30) Foreign Application Priority Data

Jan. 26, 2015 (CN) .......................... 2015 1 0038372

(51) Int. Cl.
*H01L 27/12* (2006.01)
*H01L 21/786* (2006.01)
(Continued)

(52) U.S. Cl.
CPC ...... *H01L 27/1288* (2013.01); *H01L 21/0274* (2013.01); *H01L 21/47573* (2013.01);
(Continued)

(58) Field of Classification Search
CPC combination set(s) only.
See application file for complete search history.

(56) References Cited

U.S. PATENT DOCUMENTS

2011/0309339 A1* 12/2011 You .................. H01L 27/3248
257/40
2012/0193624 A1* 8/2012 You .................. H01L 27/124
257/57
(Continued)

FOREIGN PATENT DOCUMENTS

CN    102237305 A    11/2011
CN    103165525 A    6/2013
(Continued)

OTHER PUBLICATIONS

Office Action in Chinese Patent Application No. 201510038372.8, dated Dec. 13, 2016.
(Continued)

*Primary Examiner* — Mamadou Diallo
(74) *Attorney, Agent, or Firm* — Brooks Kushman P.C.

(57) ABSTRACT

A method for manufacturing an array substrate includes coating a photoresist onto an insulation layer including a gate insulation layer and an etch stop layer, wherein the gate insulation layer covers a conductive pattern and the etch stop layer covers a semiconductive pattern. The method further includes exposing the photoresist to form a photoresist
(Continued)

partially-reserved region and a photoresist unreserved region. The method further includes performing a first etching process to at least partially remove a portion of the insulation layer located at a position corresponding to the photoresist unreserved region, to form an intermediate hole. The method further includes performing a second etching process to form the first via hole and form the second via hole at a position of the intermediate hole, thereby to reveal the semiconductive pattern and the conductive pattern at positions corresponding to the first via hole and the second via hole, respectively.

20 Claims, 3 Drawing Sheets

(51) Int. Cl.
*H01L 21/84* (2006.01)
*H01L 21/027* (2006.01)
*H01L 21/4757* (2006.01)
*H01L 21/768* (2006.01)
*H01L 29/66* (2006.01)
*H01L 29/786* (2006.01)

(52) U.S. Cl.
CPC ........ *H01L 21/76802* (2013.01); *H01L 21/84* (2013.01); *H01L 27/12* (2013.01); *H01L 27/1225* (2013.01); *H01L 29/66969* (2013.01); *H01L 29/7869* (2013.01)

(56) References Cited

U.S. PATENT DOCUMENTS

| 2013/0045602 | A1* | 2/2013 | Lu | H01L 21/31144 |
| | | | | 438/700 |
| 2014/0175443 | A1* | 6/2014 | Xie | H01L 27/1288 |
| | | | | 257/59 |
| 2015/0294859 | A1* | 10/2015 | Sera | H01L 21/0274 |
| | | | | 438/527 |
| 2015/0357356 | A1* | 12/2015 | Kim | H01L 27/1288 |
| | | | | 257/43 |

FOREIGN PATENT DOCUMENTS

| CN | 103441100 A | 12/2013 |
| CN | 103489826 A | 1/2014 |
| CN | 103500730 A | 1/2014 |
| CN | 104022126 A | 9/2014 |
| CN | 104576542 A | 4/2015 |

OTHER PUBLICATIONS

International Search Report and Written Opinion in PCT International Application No. PCT/CN2015/077903, dated Oct. 8, 2015.

* cited by examiner

ARRAY SUBSTRATE, METHOD FOR MANUFACTURING THE SAME, AND DISPLAY APPARATUS

CROSS REFERENCE OF RELATED APPLICATION

This application is the U.S. national phase of PCT Application No. PCT/CN2015/0779903 filed on Apr. 30, 2015, of which claims a priority of Chinese patent application No. 201510038372.8 filed on Jan. 26, 2015, the disclosure of which is incorporated herein by reference in its entirety.

TECHNICAL FIELD

The present disclosure relates to the field of displaying technology, and in particular to an array substrate, a method for manufacturing the array substrate, and a display apparatus.

BACKGROUND

An oxide Thin Film Transistor (TFT) differs from a conventional amorphous silicon TFT in that a semiconductor layer is made of a metal oxide material, such as Indium Gallium Zinc Oxide (IGZO). The oxide TFT has advantages such as being transparent, insensitive to light, high light intensity, low power consumption and high electron mobility, and thus has been widely used in the industry.

However, for the metal oxide semiconductor layer, the environment condition is highly demanded, and both oxygen gas and steam in the air may adversely affect its characteristics. Thus, an Etch Stop Layer (ESL) is provided on the metal oxide semiconductor layer. As illustrated in FIG. 1, during the production of an oxide TFT array substrate in the related art, a gate electrode 2 and a common electrode line 3 are formed on a substrate 1, and then a gate insulation layer 4 is formed. An oxide semiconductor layer 6 is formed on the gate insulation layer 4, and then an etch stop layer 5 is formed on the substrate 1 on which the oxide semiconductor layer 6 has been formed. A source electrode via hole 8 and a drain electrode via hole 9 are formed and pass through the etch stop layer 5, and a common electrode via hole 10 is formed and passes through the etch stop layer 5 and the gate insulation layer 4, so that the source electrode may be connected to the oxide semiconductor layer 6 through the source electrode via hole 8, the drain electrode may be connected to the oxide semiconductor layer 6 through the drain electrode via hole 9, and the common electrode may be connected to the common electrode line 3 through the common electrode via hole 10. In the related art, the source electrode via hole 8, the drain electrode via hole 9 and the common electrode via hole 10 are formed by a single etching process. It will take a long period of time to form the common electrode via hole 10 by a single etching process, because the via hole 10 is deep and it is required to pass through both the etch stop layer 5 and the gate insulation layer 4. Both the source electrode via hole 8 and the drain electrode via hole 9 only need to pass through the etch stop layer 5 and thus are shallower than the via hole 10. As illustrated in FIG. 1, when it takes a long period of time for the etching process, a portion of the oxide semiconductor layer 6 located at positions corresponding to the source electrode via hole 8 and the drain electrode via hole 9 may be etched off, and further portions of the gate insulation layer 4 located at the positions corresponding to the source electrode via hole 8 and the drain electrode via hole 9 may be etched off. As a result, either the source electrode or the drain electrode may be connected to the gate electrode, resulting in a condition of data line and gate line short (DGS).

In the related art, a further patterning process for the gate insulation layer is usually introduced for solving the above problem. In other words, the gate insulation layer is formed in advance, and a via hole passing through the gate insulation layer is formed at a position corresponding to the common electrode via hole 10. And then, the source electrode via hole 8, the drain electrode via hole 9 and the common electrode via hole 10 passing through the etch stop layer are formed by a single etching process. However, in this way, the number of the patterning processes for the array substrate as well as the production cost thereof will be increased.

SUMMARY

An object of the present disclosure is to provide an array substrate, a method for manufacturing the array substrate and a display apparatus, so as to, without any additional patterning process, prevent an oxide semiconductor layer and a gate insulating layer located at positions corresponding to shallow holes from being etched off during the long-term etching process when the shallow holes and deep holes are etched simultaneously, thereby to prevent the occurrence of DGS.

In one aspect, the present disclosure provides in some embodiments a method for manufacturing an array substrate, including steps of: coating a photoresist onto an insulation layer including a gate insulation layer and an etch stop layer, wherein the gate insulation layer covers a conductive pattern and the etch stop layer covers a semiconductive pattern; exposing the photoresist to form at least a photoresist partially-reserved region corresponding to a region where a first via hole is formed, and a photoresist unreserved region corresponding to a region where a second via hole is formed; performing a first etching process so as to at least partially remove a portion of the insulation layer located at a position corresponding to the photoresist unreserved region, thereby to form an intermediate hole; and performing a second etching process, so as to form the first via hole, and form the second via hole at a position of the intermediate hole, thereby to reveal the semiconductive pattern and the conductive pattern at positions corresponding to the first via hole and the second via hole, respectively, a depth of the first via hole being less than a depth of the second via hole.

Alternatively, subsequent to the step of performing the second etching process so as to form the first via hole and the second via hole, the method further includes: removing the remaining photoresist on the insulation layer.

Alternatively, prior to the step of performing the second etching process, the method further includes: removing the photoresist at the photoresist partially-reserved region.

Optionally, the first via hole passes through the etch stop layer, and the second via hole passes through both the etch stop layer and the gate insulation layer.

Alternatively, the step of performing the first etching process so as to form the intermediate hole further includes: removing a portion of the gate insulation layer and the entire etch stop layer corresponding to the photoresist unreserved region so as to form the intermediate hole. The step of performing the second etching process so as to form the first via hole and form the second via hole at the position of the intermediate hole further includes: removing the entire etch stop layer corresponding to the photoresist partially-reserved region so as to form the first via hole, and removing the remaining portion of the gate insulation layer at a position corresponding to the intermediate hole so as to form the second via hole.

Alternatively, a thickness of the remaining portion of the gate insulation layer at the position corresponding to the intermediate hole is equal to a thickness of the etch stop layer corresponding to the photoresist partially-reserved region.

Optionally, prior to the step of coating the photoresist onto the insulation layer, the method further includes: providing a base substrate; forming a gate electrode and the conductive pattern on the base substrate; forming the gate insulation layer on the base substrate with the gate electrode and the conductive pattern; forming the semiconductor pattern on the gate insulation layer at a position corresponding to the gate electrode; and forming the etch stop layer on the semiconductor pattern and the gate insulation layer.

Optionally, subsequent to the step of removing the remaining photoresist on the insulation layer, the method further includes: forming a source electrode, a drain electrode and a common electrode on the substrate, the conductive pattern being a common electrode line, the semiconductive pattern being an oxide semiconductor layer, the source electrode and the drain electrode being connected to the oxide semiconductor layer through the respective first via holes, and a common electrode being connected to the common electrode line through the second via hole; forming a passivation layer; and forming a pixel electrode on the passivation layer.

Alternatively, the step of exposing the photoresist is performed using a half-tone mask.

Alternatively, the half-tone mask includes a translucent region corresponding to the first via hole in the array substrate and a transparent region corresponding to the second via hole in the array substrate, and exposure at the translucent region is less than exposure at the transparent region. The step of exposing the photoresist to form at least a photoresist partially-reserved region and a photoresist unreserved region further includes: exposing the photoresist coated on the insulation layer by the half-tone mask, so as to form the photoresist unreserved region corresponding to the transparent region and the photoresist partially-reserved region corresponding to the translucent region.

In another aspect, the present disclosure provides in some embodiments an array substrate manufactured by the above-mentioned method.

In yet another aspect, the present disclosure provides in some embodiments a display apparatus including the above-mentioned array substrate.

According to the embodiments of the present disclosure, the deep holes and the shallow holes are formed by a single exposing process and two etching processes in a single patterning process, so as to, without any additional patterning process, prevent the shallow holes from being over-etched when the shallow holes and the deep holes are etched simultaneously, thereby to, for the oxide TFT array substrate, prevent the occurrence of DGS when the oxide semiconductor layer and the gate insulation layer are etched off at the positions corresponding to the shallow holes.

DETAILED DESCRIPTION

Figure 1:
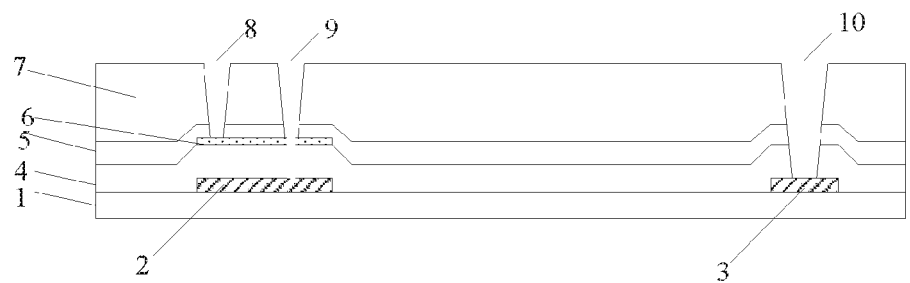
FIG. 1 is a schematic view showing the formation of via holes by dry etching in the related art.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in some embodiments an array substrate, a method for manufacturing the array substrate and a display apparatus, so as to, without any additional patterning process, prevent an oxide semiconductor layer and a gate insulating layer located at positions corresponding to shallow holes from being etched off during the long-term etching process when the shallow holes and deep holes are etched simultaneously, thereby to prevent the occurrence of DGS.

First Embodiment

The present disclosure provides in this embodiment a method for manufacturing an array substrate, which includes steps of: coating a photoresist onto an insulation layer including a gate insulation layer and an etch stop layer, wherein the gate insulation layer covers a conductive pattern and the etch stop layer covers a semiconductive pattern; exposing the photoresist to form at least a photoresist partially-reserved region corresponding to a region where a first via hole is formed, and a photoresist unreserved region corresponding to a region where a second via hole is formed, the photoresist at the photoresist partially-reserved region is of a thickness less than the photoresist at a photoresist fully-reserved region and greater than the photoresist at the photoresist unreserved region; performing a first etching process so as to at least partially remove a portion of the insulation layer located at a position corresponding to the photoresist unreserved region, thereby to form an intermediate hole; and performing a second etching process, so as to form the first via hole, and form the second via hole at a position of the intermediate hole, thereby to reveal the semiconductive pattern and the conductive pattern at positions corresponding to the first via hole and the second via hole, respectively, a depth of the first via hole being less than a depth of the second via hole.

At least partially removing a portion of the insulation layer at a position corresponding to the photoresist unreserved region may include removing the entire insulation layer so that the intermediate hole directly forms the second via hole and the conductive pattern is revealed; or include removing a portion of the insulation layer to form the intermediate hole, and when performing the second etching process to form the first via hole, continuing to etch the remaining portion of the insulation layer at the position corresponding to the intermediate hole to form the second via hole, so as to reveal the semiconductive pattern and the conductive pattern at the positions corresponding to the first via hole and the second via hole, respectively. In this way, it is able to prevent the shallow holes from being overetched when both the deep holes and the shallow holes are etched simultaneously.

Subsequent to the step of performing the second etching process so as to form the first via hole and the second via hole, the method further includes removing the remaining photoresist on the insulation layer.

Prior to the step of performing the second etching process, the method further includes: removing the photoresist at the photoresist partially-reserved region.

To be specific, the photoresist at the photoresist partially-reserved region may be removed by an ashing process using a mixture of oxygen and sulfur hexafluoride. A ratio of oxygen to sulfur hexafluoride may be 30:1.

When both the shallow holes and the deep holes are formed simultaneously by a single etching process, it will take a long period of time to etch the deep holes, so the shallow holes may inevitably be overetched. In this embodiment, the deep hole (the second via hole) and the shallow hole (the first via hole) are formed by two etching steps in a single patterning process. Specifically, a portion of the deep hole is formed during the first etching process, and the shallow hole and the other portion of the deep hole are formed during the second etching process. In this way, it is able to, without any additional patterning process, prevent the shallow hole from being overetched during the long-term etching process when the shallow hole and the deep hole are etched simultaneously. In this embodiment, the above method may be adapted to an oxide TFT array substrate, so as to prevent the occurrence of DGS when an oxide semiconductor layer and a gate insulation layer at a position corresponding to the shallow hole are etched off.

Furthermore, the insulation layer includes a gate insulation layer and an etch stop layer. The first via hole passes through the etch stop layer and is configured to connect the source electrode and the oxide semiconductor layer, and connect the drain electrode and the oxide semiconductor layer. The second via hole passes through both the etch stop layer and the gate insulation layer, and is configured to connect a common electrode and a common electrode line. In an alternative embodiment, during the manufacture of the oxide TFT array substrate, the first via hole is etched so as to reveal the oxide semiconductor layer, and the second via hole is etched so as to reveal the common electrode line.

Furthermore, the step of performing the first etching process so as to form the intermediate hole further includes removing a portion of the gate insulation layer and the entire etch stop layer corresponding to the photoresist unreserved region so as to form the intermediate hole. The step of performing the second etching process so as to form the first via hole and form the second via hole at the position of the intermediate hole further includes removing the entire etch stop layer corresponding to the photoresist partially-reserved region so as to form the first via hole, and removing the remaining portion of the gate insulation layer at a position corresponding to the intermediate hole so as to form the second via hole.

Alternatively, a thickness of the remaining portion of the gate insulation layer at a position corresponding to the intermediate hole is equal to a thickness of the etch stop layer corresponding to the photoresist partially-reserved region. In general, the gate insulation layer and the etch stop layer may be made of an identical material, and the thickness of the remaining portion of the gate insulation layer is equal to the thickness of the etch stop layer. In this way, during the second etching process, it is able to exactly etch off the etch stop layer while etching off the remaining portion of the gate insulation layer, without any incomplete etching or overetching.

Furthermore, prior to the step of coating the photoresist onto the insulation layer, the method further includes: providing a base substrate; forming a gate electrode and the conductive pattern on the base substrate; forming the gate insulation layer on the base substrate with the gate electrode and the conductive pattern; forming the semiconductor pattern on the gate insulation layer at a position corresponding to the gate electrode; and forming the etch stop layer on the semiconductor pattern and the gate insulation layer.

Subsequent to the step of removing the remaining photoresist on the insulation layer, the method further includes: forming a source electrode, a drain electrode and a common electrode on the substrate, the conductive pattern being the common electrode line, the semiconductive pattern being the oxide semiconductor layer, the source electrode and the drain electrode being connected to the oxide semiconductor layer through the respective first via holes, and the common electrode being connected to the common electrode line through the second via hole; forming a passivation layer; and forming a pixel electrode on the passivation layer.

Alternatively, the step of exposing the photoresist is performed using a half-tone mask. The half-tone mask includes a translucent region corresponding to the first via hole in the array substrate and a transparent region corresponding to the second via hole in the array substrate, and exposure at the translucent region is less than exposure at the transparent region.

Furthermore, the step of exposing the photoresist to form at least a photoresist partially-reserved region and a photoresist unreserved region further includes exposing the photoresist coated on the insulation layer by the half-tone mask, so as to form the photoresist unreserved region corresponding to the transparent region and the photoresist partially-reserved region corresponding to the translucent region.

Embodiment 2

In this embodiment, the method will be described in conjunction with the drawings by taking an oxide TFT array substrate as an example. Obviously, the following embodiments are merely a part of, rather than all of, the embodiments of the present disclosure, and based on these embodiments, a person skilled in the art may, without any creative effort, obtain the other embodiments, which also fall within the scope of the present disclosure.

In this embodiment, the method includes the following steps.

Figure 2:
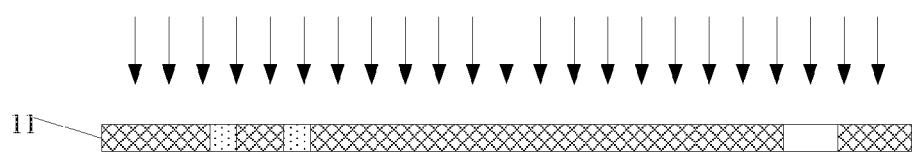
FIG. 2 is a schematic view showing an array substrate where a photoresist on an etch stop layer is exposed using a half-tone mask according to one embodiment of the present disclosure.

Step E: as illustrated in FIG. 2, coating a photoresist 7 on a base substrate with a gate insulation layer 4 and an etch stop layer 5, and exposing the photoresist with a mask 11. The mask 11 includes a translucent region corresponding to a source electrode via hole and a drain electrode via hole in the array substrate and a transparent region corresponding to a common electrode via hole in the array substrate. The source electrode via hole, the drain electrode via hole and the common electrode via hole are formed by a single patterning process, and a depth of each of the source electrode via hole and the drain electrode via hole is less than a depth of the common electrode via hole.

The mask 11 is a half-tone mask, which includes a translucent region corresponding to the first via hole in the array substrate and a transparent region corresponding to the second via hole in the array substrate. Exposure at the translucent region is less than exposure at the transparent region.

Figure 3:
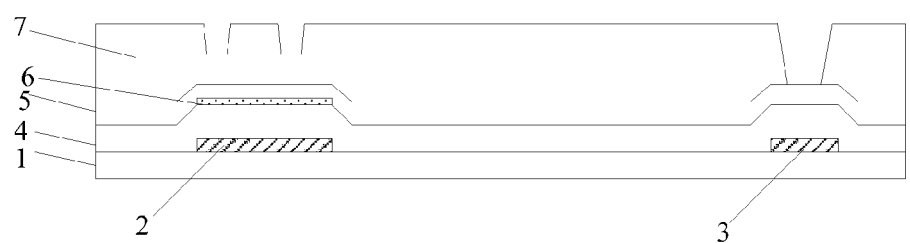
FIG. 3 is a schematic view showing the array substrate where the photoresist is developed according to one embodiment of the present disclosure.

Step F: as illustrated in FIG. 3, developing the photoresist to form a photoresist partially-reserved region corresponding to the source electrode via hole and the drain electrode via hole, a photoresist unreserved region (i.e. a photoresist fully-removed region) corresponding to the common electrode via hole, and a photoresist reserved region corresponding to other regions.

Figure 4:
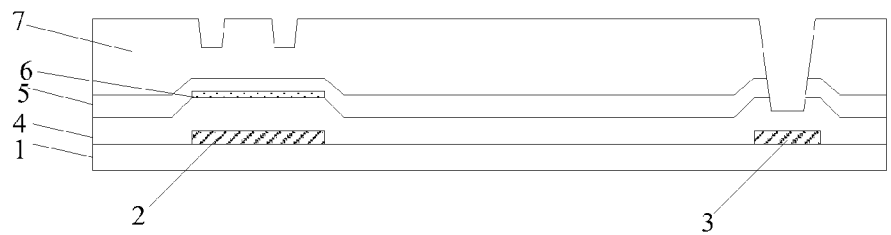
FIG. 4 is a schematic view showing the array substrate where a first etching process is performed on the etch stop layer according to an embodiment of the present disclosure.

Step G: as illustrated in FIG. 4, performing a first etching process to remove the entire etch stop layer 5 and a portion of the gate insulation layer 4 at the photoresist unreserved region corresponding to the common electrode via hole, so as to form an intermediate hole. The etching step here is dry etching. Furthermore, in this step, the entire etch stop layer and the entire gate insulation layer 4 may also be removed so as to reveal the common electrode line 3.

Figure 5:
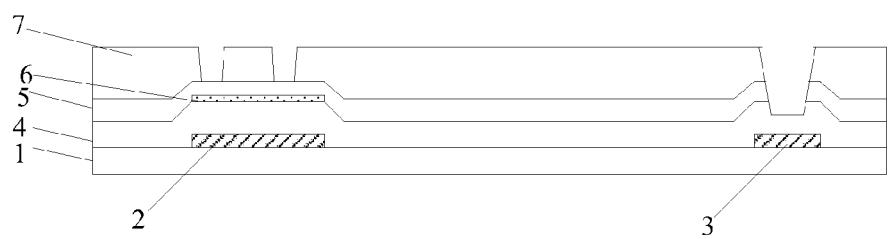
FIG. 5 is a schematic view showing the array substrate where the photoresist at the photoresist partially-reserved region is removed by ashing according to one embodiment of the present disclosure.

Step H: as illustrated in FIG. 5, removing the photoresist at the photoresist partially-reserved region corresponding to the source electrode via hole and the drain electrode via hole by an ashing process. To be specific, the ashing process may be implemented using a mixture of oxygen and sulfur hexafluoride, and a ratio of oxygen to sulfur hexafluoride may be 30:1.

Figure 6:
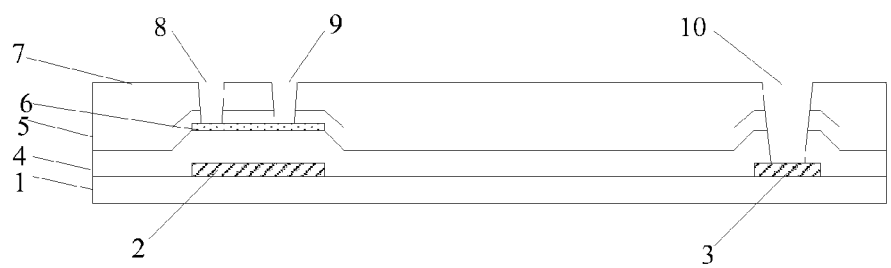
FIG. 6 is a schematic view showing the array substrate where a second etching process is performed on the etch stop layer according to one embodiment of the present disclosure.

Step I: as illustrated in FIG. 6, performing a second etching process to remove the entire etch stop layer 5 at the ashed photoresist partially-reserved region corresponding to the source electrode via hole and the drain electrode via hole, and the remaining portion of the gate insulation layer at the position corresponding to the common electrode via hole (i.e. the position of the intermediate via hole), so as to reveal the oxide semiconductor layer 6 at the positions corresponding to the source electrode via hole and the drain electrode via hole, and reveal the common electrode 3 at the position corresponding to the common electrode via hole, thereby to form the source electrode via hole 8, the drain electrode via hole 9 and the common electrode via hole 10. The etching step here is dry etching. When the entire gate insulation layer corresponding to the region of the common electrode via hole has been removed in the step G, the intermediate via hole formed in this step is just the common electrode via hole 10. In this step, the dry etching is adopted, so the common electrode line 3 made of a gate metal layer is not adversely affected.

The gate insulation layer and the etch stop layer may be made of an identical material. The thickness of the remaining portion of the gate insulation layer at the position corresponding to the intermediate hole is equal to the thickness of the etch stop layer. As a result, during the second etching process, it is able to exactly etch off the etch stop layer while etching off the remaining gate insulation layer, thereby to prevent the occurrence of incomplete etching or overetching.

Figure 7:
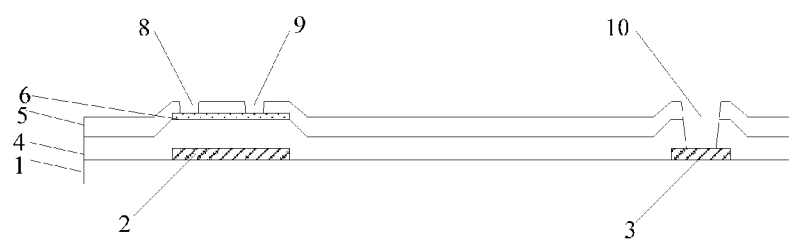
FIG. 7 is a schematic view showing the array substrate where the photoresist on the etch stop layer is removed according to one embodiment of the present disclosure.

Step J: as illustrated in FIG. 7, removing the remaining photoresist.

Prior to step E, the method further includes the following steps.

Step A: providing the base substrate 1, and forming patterns of a gate electrode 2 and the common electrode line 3 on the base substrate 1.

The base substrate 1 may be a glass substrate or a quartz substrate. To be specific, a gate metal layer with a thickness of 500 Å-4000 Å may be deposited on the base substrate 1 by sputtering or thermal evaporation. The gate metal layer may be made of Cu, Al, Ag, Mo, Cr, Nd, Ni, Mn, Ti, Ta or W, or an alloy thereof. The gate metal layer may be of a single-layered structure or a multi-layered structure, and the multi-layered structure may include, for example, Cu\Mo, Ti\Cu\Ti or Mo\Al\Mo. The photoresist is coated onto the gate metal layer, and then exposed with a mask, so as to form a photoresist reserved region corresponding to regions where the patterns of the gate electrode 2 and the common electrode line 3 are located, and a photoresist unreserved region corresponding to the other regions. The photoresist is then developed so as to fully remove the photoresist at the photoresist unreserved region, and the thickness of the photoresist at the photoresist reserved region remains unchanged. Then, a gate metal film at the photoresist unreserved region is etched off by an etching process, and the remaining photoresist is removed, so as to form the patterns of the gate electrode 2 and the common electrode line 3.

Step B: forming the gate insulation layer 4 on the base substrate 1 obtained after step A.

To be specific, the gate insulation layer 4 with a thickness of 500 Å-5000 Å may be deposited on the base substrate 1 by Plasma Enhanced Chemical Vapor Deposition (PECVD) after step A. The gate insulation layer 4 may be made of oxide, nitride or oxynitride, with a reactive gas consisting of $SiH_4$, $NH_3$ and $N_2$, or $SiH_2Cl_2$, $NH_3$ and $N_2$.

Step C: forming a pattern of the oxide semiconductor layer 6 on the base substrate 1 obtained after step B.

To be specific, the oxide semiconductor layer 6 may be deposited on the base substrate 1 after step B. The oxide semiconductor layer may be made of IGZO. ITZO or ZnON, and have a thickness of 500 Å-5000 Å. The photoresist is coated onto the oxide semiconductor layer 6 and then exposed with a mask, so as to form a photoresist reserved region corresponding to a region where the pattern of the oxide semiconductor layer 6 is located, and a photoresist unreserved region corresponding to the other regions. The photoresist is then developed so as to fully remove the photoresist at the photoresist unreserved region, and a thickness of the photoresist at the photoresist reserved region remains unchanged. The gate metal film at the photoresist unreserved region is fully etched off by an etching process, and the remaining photoresist is removed, so as to form the pattern of the oxide semiconductor layer 6.

Step D: forming the etch stop layer 5 on the base substrate 1 obtained after step C.

To be specific, the etch stop layer 5 having a thickness of 500 Å-2000 Å may be deposited on the base substrate 1 by PECVD after step C. The etch stop layer 5 may be made of oxide, nitride or oxynitride, with a reactive gas consisting of $S_iH_4$, $NH_3$ and $N_2$, or $S_iH_2Cl_2$, $NH_3$ and $N_2$.

Subsequent to step J, the method further includes the following steps.

Step K: forming the source electrode 12, the drain electrode 13 and the common electrode 14 on the base substrate 1 obtained after step J.

To be specific, a source/drain metal layer having a thickness of 2000 Å-4000 Å may be deposited by magnetron sputtering, thermal evaporation or any other film forming process. The source/drain metal layer may be made of Cu, Al, Ag, Mo, Cr, Nd, Ni, Mn, Ti, Ta or W, or an alloy thereof. The source/drain metal layer may be of a single-layered structure or a multi-layered structure, and the multi-layered structure may include, for example, Cu\Mo, Ti\Cu\Ti, or Mo\Al\Mo. The photoresist is coated onto the source/drain metal layer and then exposed with a mask, so as to form a photoresist reserved region corresponding to regions where the patterns of the source electrode 12, the drain electrode 13 and the common electrode 14 are located, and a photoresist unreserved region corresponding to the other regions. The photoresist is then developed so as to fully remove the photoresist at the photoresist unreserved region, and a thickness of the photoresist at the photoresist reserved region remains unchanged. The source/drain metal layer at the photoresist unreserved region is then fully etched off, and the remaining photoresist is removed, so as to form the source electrode 12, the drain electrode 13 and the common electrode 14. The source electrode 12 is connected to the oxide semiconductor layer 6 through the source electrode via hole 8, the drain electrode 13 is connected to the oxide semiconductor layer 6 through the drain electrode via hole 9, and the common electrode 14 is connected to the common electrode line 3 through the common electrode via hole 10.

Figure 8:
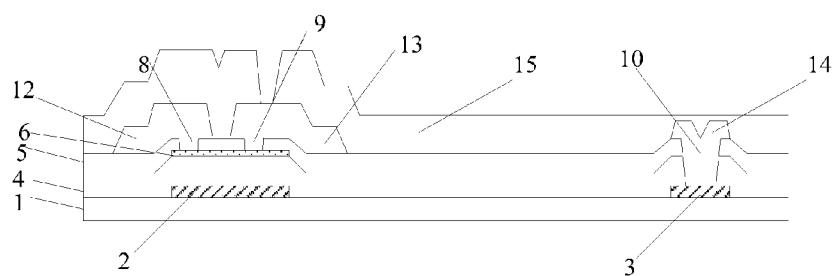
FIG. 8 is a schematic view showing the array substrate where a source electrode, a drain electrode, a common electrode and a passivation layer are formed on a base substrate according to one embodiment of the present disclosure.

Step L: as illustrated in FIG. 8, forming the passivation layer 15 having a passivation layer via hole on the base substrate 1 obtained after step K.

To be specific, the passivation layer 15 having a thickness of 2000 Å-1000 Å may be deposited on the base substrate 1 by magnetron sputtering, thermal evaporation, PECVD or any other film forming process. The passivation layer 15 may be made of oxide, nitride or oxynitride. More specifically, the passivation layer 15 may be made of $S_iN_x$, $S_iO_x$, $S_i(ON)_x$ or $Al_2O_3$. The passivation layer may be of a single-layered structure, or a double-layered structure made of silicon nitride and silicon oxide. A reactive gas for silicon oxide may be $S_iH_4$ or $N_2O$, and a reactive gas for nitride or oxynitride may include $S_iH_4$, $NH_3$ and $N_2$, or $S_iH_2Cl_2$, $NH_3$ and $N_2$. The pattern of the passivation layer 15 having the passivation layer via hole may be formed by a single patterning process. To be specific, an organic resin, e.g., benzocyclobutene (BCB) or any other organic photosensitive material, having a thickness of about 4000 Å to 30000 Å may be coated onto the passivation layer 15, exposed and developed, and then etched by a single patterning process so as to form the pattern of the passivation layer 15 having the passivation via hole.

Step M: forming a pattern of the pixel electrode on the base substrate 1 obtained after step L.

To be specific, a transparent conductive layer having a thickness of about 300 Å-1500 Å is deposited on the base substrate by sputtering or thermal evaporation after step 6. The transparent conductive layer may be made of ITO, IZO or any other transparent metal oxide. The photoresist is coated onto the transparent conductive layer and then exposed with a mask, so as to form a photoresist reserved region corresponding to a region where the pattern of the pixel electrode is located, and a photoresist unreserved region corresponding to the other regions. The photoresist is then developed so as to fully remove the photoresist at the photoresist unreserved region, and a thickness of the photoresist at the photoresist reserved region remains unchanged. Then, a transparent conductive film at the photoresist unreserved region is fully etched off by an etching process, and the remaining photoresist is removed, so as to form the pattern of the pixel electrode. The pixel electrode is connected to the drain electrode through the passivation layer via hole.

In this embodiment, the deep hole (i.e. the common electrode via hole) and the shallow holes (i.e. the source electrode via hole and the drain electrode via hole) are formed by two etching steps in a single patterning process. As a result, it is able to, without any additional patterning process, prevent the shallow hole from being overetched during the long-term etching process when the shallow holes and the deep hole are etched simultaneously. In addition, for an oxide TFT array substrate, it is able to prevent the occurrence of DGS when the oxide semiconductor layer and the gate insulation layer at the position corresponding to the shallow hole are etched off.

Embodiment 3

The present disclosure provides in this embodiment an array substrate manufactured by the above-mentioned method.

Embodiment 4

The present disclosure provides in this embodiment a display apparatus including the above-mentioned array substrate. The display device may be any product or member having a display function, such as a Liquid Crystal Display (LCD) panel, a LCD TV, a LCD monitor, a digital photo frame, a mobile phone, a tablet computer, a navigator, pr an electronic paper.

The above are merely the preferred embodiments of the present disclosure. It should be noted that, a person skilled in the art may make further improvements and modifications without departing from the principle of the present disclosure, and these improvements and modifications shall also fall within the scope of the present disclosure.

What is claimed is:

1. A method for manufacturing an array substrate, comprising steps of:
    coating a photoresist onto an insulation layer comprising a gate insulation layer and an etch stop layer, wherein the gate insulation layer covers a conductive pattern and the etch stop layer covers a semiconductive pattern;
    exposing the photoresist to form at least a photoresist partially-reserved region corresponding to a region where a first via hole is formed, and a photoresist unreserved region corresponding to a region where a second via hole is formed;
    performing a first etching process so as to at least partially remove a portion of the insulation layer located at a position corresponding to the photoresist unreserved region, thereby to form an intermediate hole; and
    performing a second etching process, so as to form the first via hole, and form the second via hole at a position of the intermediate hole, thereby to reveal the semiconductive pattern and the conductive pattern at positions corresponding to the first via hole and the second via hole, respectively, a depth of the first via hole being less than a depth of the second via hole.

2. The method according to claim 1, wherein subsequent to the step of performing the second etching process so as to form the first via hole and the second via hole, the method further includes removing the remaining photoresist on the insulation layer.

3. The method according to claim 1, wherein prior to the step of performing the second etching process, the method further includes: removing the photoresist at the photoresist partially-reserved region.

4. The method according to claim 1, wherein the first via hole passes through the etch stop layer, and the second via hole passes through both the etch stop layer and the gate insulation layer.

5. The method according to claim 1, wherein the step of performing the first etching process so as to form the intermediate hole further comprises:
removing a portion of the gate insulation layer and the entire etch stop layer corresponding to the photoresist unreserved region so as to form the intermediate hole, and
the step of performing the second etching process so as to form the first via hole and form the second via hole at the position of the intermediate hole further comprises:
removing the entire etch stop layer corresponding to the photoresist partially-reserved region so as to form the first via hole, and removing the remaining portion of the gate insulation layer at a position corresponding to the intermediate hole so as to form the second via hole.

6. The method according to claim 5, wherein a thickness of the remaining portion of the gate insulation layer at the position corresponding to the intermediate hole is equal to a thickness of the etch stop layer corresponding to the photoresist partially-reserved region.

7. The method according to claim 1, wherein prior to the step of coating the photoresist onto the insulation layer, the method further comprises:
providing a base substrate;
forming a gate electrode and the conductive pattern on the base substrate;
forming the gate insulation layer on the base substrate with the gate electrode and the conductive pattern;
forming the semiconductor pattern on the gate insulation layer at a position corresponding to the gate electrode; and
forming the etch stop layer on the semiconductor pattern and the gate insulation layer.

8. The method according to claim 2, wherein subsequent to the step of removing the remaining photoresist on the insulation layer, the method further comprises:
forming a source electrode, a drain electrode and a common electrode on the substrate, the conductive pattern being a common electrode line, the semiconductive pattern being an oxide semiconductor layer, the source electrode and the drain electrode being connected to the oxide semiconductor layer through the respective first via holes, and the common electrode being connected to the common electrode line through the second via hole;
forming a passivation layer; and
forming a pixel electrode on the passivation layer.

9. The method according to claim 1, wherein the step of exposing the photoresist is performed using a half-tone mask.

10. The method according to claim 9, wherein the half-tone mask comprises a translucent region corresponding to the first via hole in the array substrate and a transparent region corresponding to the second via hole in the array substrate, exposure at the translucent region is less than exposure at the transparent region, and
the step of exposing the photoresist to form at least a photoresist partially-reserved region and a photoresist unreserved region further comprise:
exposing the photoresist coated on the insulation layer by the half-tone mask, so as to form the photoresist unreserved region corresponding to the transparent region and the photoresist partially-reserved region corresponding to the translucent region.

11. An array substrate manufactured by the method according to claim 1.

12. A display apparatus comprising the array substrate according to claim 11.

13. The method according to claim 2, wherein prior to the step of performing the second etching process, the method further comprises: removing the photoresist at the photoresist partially-reserved region.

14. The method according to claim 2, wherein the first via hole passes through the etch stop layer, and the second via hole passes through both the etch stop layer and the gate insulation layer.

15. The method according to claim 3, wherein the first via hole passes through the etch stop layer, and the second via hole passes through both the etch stop layer and the gate insulation layer.

16. The method according to claim 5, wherein prior to the step of coating the photoresist onto the insulation layer, the method further comprises:
providing a base substrate;
forming a gate electrode and the conductive pattern on the base substrate;
forming the gate insulation layer on the base substrate with the gate electrode and the conductive pattern;
forming the semiconductor pattern on the gate insulation layer; and
forming the etch stop layer on the semiconductor pattern and the gate insulation layer.

17. The method according to claim 6, wherein prior to the step of coating the photoresist onto the insulation layer, the method further comprises:
providing a base substrate;
forming a gate electrode and the conductive pattern on the base substrate;
forming the gate insulation layer on the base substrate with the gate electrode and the conductive pattern;
forming the semiconductor pattern on the gate insulation layer; and
forming the etch stop layer on the semiconductor pattern and the gate insulation layer.

18. The method according to claim 2, wherein the step of exposing the photoresist is performed using a half-tone mask.

19. The method according to claim 1, wherein the intermediate hole is the second via hole.

20. The method according to claim 1, wherein the first etching process and the second etching process are dry etching.

* * * * *